US008540903B2

(12) United States Patent
Higuchi et al.

(10) Patent No.: US 8,540,903 B2
(45) Date of Patent: Sep. 24, 2013

(54) ELECTRICALLY CONDUCTIVE PASTE, AND ELECTRICAL AND ELECTRONIC DEVICE COMPRISING THE SAME

(75) Inventors: Takayuki Higuchi, Osaka (JP); Hidenori Miyakawa, Osaka (JP); Atsushi Yamaguchi, Osaka (JP); Arata Kishi, Osaka (JP); Naomichi Ohashi, Osaka (JP)

(73) Assignee: Panasonic Corporation, Osaka (JP)

( * ) Notice: Subject to any disclaimer, the term of this patent is extended or adjusted under 35 U.S.C. 154(b) by 459 days.

(21) Appl. No.: 12/744,994

(22) PCT Filed: Nov. 21, 2008

(86) PCT No.: PCT/JP2008/003433
§ 371 (c)(1),
(2), (4) Date: May 27, 2010

(87) PCT Pub. No.: WO2009/069273
PCT Pub. Date: Jun. 4, 2009

(65) Prior Publication Data
US 2011/0049439 A1  Mar. 3, 2011

(30) Foreign Application Priority Data

Nov. 28, 2007 (JP) ................................ P2007-307125

(51) Int. Cl.
*H01B 1/02* (2006.01)
*H01B 1/22* (2006.01)
*H01B 1/12* (2006.01)
*H05K 3/20* (2006.01)
*H05K 3/30* (2006.01)
*H05K 1/00* (2006.01)
*H05K 1/18* (2006.01)
*H05K 7/00* (2006.01)

(52) U.S. Cl.
USPC ..... 252/520.1; 252/512; 252/514; 252/591.3; 252/520.3; 29/831; 29/832; 361/748

(58) Field of Classification Search
USPC .................. 252/500, 512, 514, 519.3, 520.1, 252/520.3; 29/831, 832; 361/748
See application file for complete search history.

(56) References Cited

U.S. PATENT DOCUMENTS

| 5,904,782 A * | 5/1999 | Diep-Quang ............... 148/23 |
| 2009/0020733 A1 | 1/2009 | Hirakawa et al. |
| 2009/0139608 A1 | 6/2009 | Tanaka et al. |

FOREIGN PATENT DOCUMENTS

| JP | 10-154417 | | 6/1998 |
| JP | 10-279903 | | 10/1998 |
| JP | 2002-057423 | | 2/2002 |
| JP | 2004-234900 | | 8/2004 |
| JP | 2004-315871 | | 11/2004 |
| JP | 2004-363052 | | 12/2004 |
| JP | 2005-005054 | | 1/2005 |
| JP | 2005-019310 | | 1/2005 |
| JP | 2005-071825 | | 3/2005 |
| JP | 2005071825 A * | 3/2005 |
| JP | 2005-089559 | | 4/2005 |
| WO | 2006/080247 | | 8/2006 |
| WO | 2006/109573 | | 10/2006 |

OTHER PUBLICATIONS

Supplementary European Search Report issued Nov. 11, 2010 in counterpart European Application No. EP 08 85 3410.
International Preliminary Report on Patentability and Written Opinion (in English) issued Jun. 17, 2010 in corresponding International (PCT) Application No. PCT/JP2008/003433.
International Search Report (in English) issued Jan. 27, 2009 in corresponding International (PCT) Application No. PCT/JP2008/003433.
Chinese Office Action (with English translation) issued Sep. 22, 2011 in corresponding Chinese Application No. 200880118442.9.

* cited by examiner

*Primary Examiner* — Harold Pyon
*Assistant Examiner* — Tanisha Diggs
(74) *Attorney, Agent, or Firm* — Wenderoth, Lind & Ponack, L.L.P.

(57) ABSTRACT

Disclosed is an electrically conductive paste which enables to reduce the level of void growth in a conducting pathway formed in a joint part produced after curing the electrically conductive paste in the implementation of an electronic component on a circuit board by using the electrically conductive paste, and which contains a reduced amount of a viscosity-adjusting/thixotropy-imparting additive. Two Sn-containing low-melting-point alloy particles having different melting points and different average particle diameters are selected as electrically conductive filler components to be used in an electrically conductive paste, and the two alloy particles are mixed at a predetermined ratio for use.

6 Claims, No Drawings

ELECTRICALLY CONDUCTIVE PASTE, AND ELECTRICAL AND ELECTRONIC DEVICE COMPRISING THE SAME

This is an application filed under 35 U.S.C. 371 of PCT/JP2008/003433, filed Nov. 21, 2008, which claims priority from Japan Application 2007-307125, filed Nov. 28, 2007.

TECHNICAL FIELD

The present invention relates to a method of mounting electronic parts on a substrate using electrically conductive paste and this electrically conductive paste, and the electrical and electric device using this electrically conductive paste.

BACKGROUND ART

In the field of manufacturing technology of electrical and/or electronic circuits, electrically conductive pastes are used, for example, for mounting electronic parts on a wiring substrate.

Such an electrically conductive paste is a pasty material in which the electrically conductive filler particles are dispersed in resin compositions which serves as a binder, which paste does not show electrical conductivity due to the matter that the resin compositions generally do not show electrical conductivity. However, when the resin is heated to be hardened, the electrically conductive filler particles are caused to approach each other or to contact each other, thereby the paste comes to show electrical conductivity after being hardened.

After the electrically conductive paste has hardened, the hardened resin generally resulted in a joint part. In such hardened resin in the joint part, the electrically conductive filler particles are present in a state that the filler particles contact with each other, thereby the filler particles form a connected state in the form that the filler particles contact with each other. Thus, an electrically conductive path is formed in the joint part. For example, when each electrode of a circuit board is electrically connected with each electrode of the electronic parts each other using the electrically conductive paste, the above electrically conductive path is used. Thus, it is preferable to improve the electrical conductivity in the joint part. Therefore, it is preferable to form an electrically conductive path, which has an electrical resistance as low as possible in the electrically conductive paste after hardened. It is considered that such a low electrical resistance of the electrically conductive path can be obtained, which path is formed in the electrically conductive paste after hardened, by increasing the content of the filler or increasing the contact areas/contact probability of fillers in the paste.

However, in the electrically conductive path which is formed by causing each surface of the electrically conductive filler particles to contact each other, there is a certain limit as to the attainable reduction in resistance. In addition, there has been a problem in the joint part, which has been jointed by the electrically conductive paste, that it has not so high reliability when it is subjected to a heat cycle reliability test. That is, the connection resistance value after the test increases compared with the connection resistance value before the test.

Thus, some ideas have been proposed to attain reduction in resistance in the electrically conductive path. Such ideas comprise, for example, adopting an alloy having a comparatively low melting point as a part of the ingredient of the electrically conductive filler, subjecting the alloy having a comparatively low melting point to heating treatment thereby causing the alloy to be molten, and forming an electrically conductive path among the filler particles by causing the molten alloy to connect the filler particles each other (Patent Citations 1 and 2).

Further, relating to the electrically conductive paste for filling up via holes of a circuit board, it is proposed that an electrically conductive paste comprising two kinds of low melting point metal particles A and B, each of which has a melting point lower than 230° C.; and metal particles having a low resistance having a melting point above 230° C. as its electrically conductive filler particles (Patent Citation 3).

[Patent Citation 1]
Japanese Unexamined Patent Publication (Kokai) No. 10-279903
[Patent Citation 2]
Japanese Unexamined Patent Publication (Kokai) No. 2005-089559
[Patent Citation 3]
Japanese Unexamined Patent Publication (Kokai) No. 2005-071825

DISCLOSURE OF INVENTION

Technical Problem

It seems that, each invention disclosed by the Patent Citations 1, 2 and 3 successfully attained the reduction in resistance and the stability or the reliability of the connection in the electrically conductive path relating to each application thereof at certain degrees.

However, in the electrically conductive pastes obtained by the inventions disclosed by Patent Citations 1 and 3 as well as a certain embodiment of the invention disclosed by Patent Citation 2, each of the electrically conductive filler particles has a hard surface which hardly melts in the course of the heating treatment. The inventors confirmed that there is an increased tendency that the metal having low melting point which has come to connect or cross-link the hard surfaces of the filler particles after molten and subsequently hardened, i.e. the electrically conductive path contains voids (or bubbles) therein in the case where electrical parts are mounted on a circuit board using the electrically conductive paste, wherein the hard surface, which is not molten, of the filler particles is maintained throughout the heating treatment. It is caused by the matter that the electrically conductive paste has been heat-treated on the surface of the electrically conductive filler particles which construct the hard surface that does not melt and near the surface of the electrodes of the electronic parts and the circuit board throughout the heating treatment of the joint part.

The reason why such voids reside in the electrically conductive path is considered as follows. That is, gases contained in the ingredients which were used for the electrically conductive paste or gases that were generated during the heat treatment of the electrically conductive paste cause to emanate air bubbles within the ingredients of the electrically conductive filler particles during the heat treatment thereof, thereafter the air bubbles are present close to the hard surface, which hardly melts, of the filler particles. Before such air bubbles could escape from the ingredients of the electrically conductive filler particles and the surrounding resin compositions, the ingredients of the electrically conductive filler particles are brought into hardened state, thereby the voids have been formed within the electrically conductive path.

These voids present in the electrically conductive path substantially decrease the cross-section area, which contributes to the electrical conductivity in the electrically conductive path, so that the voids may be a factor to inhibit the reduction in resistance in the electrically conductive path. Accordingly, it is desirable to suppress the formation of such voids within the electrically conductive path in the joint part.

Moreover, after electrical parts were mounted, when the joint part, in which the voids exist within the metal that formed the electrically conductive path therein, is subjected to heat treatment test, the alloy and the surrounding resin may expand and/or contract. Thereafter, a phenomenon that the connection resistance value fluctuates may occur.

In addition, Patent Citation 2 discloses an invention wherein 100% of the electrically conductive filler ingredients are constructed with metals having low melting point in paragraph numbers 0057 and 0058 therein. Since it describes that the ingredient of the electrically conductive filler is one element or an alloy of two or more metals selected from the group consisting of Bi (bismuth), In (indium), Sn (tin), Pb (lead) and Cu (copper), it may be understood that the electrically conductive filler ingredient has one composition (that is, a single composition).

The inventors confirmed that when metal particles having such a single composition is used as the electrically conductive filler particles and it is subjected to the predetermined heating treatment, there is a tendency that the voids are easily formed within the electrically conductive path after it is hardened.

When the filler particles have comparatively close particle diameters in the electrically conductive paste, that is, the filler particles have a relatively narrow range of particle size distribution, the filler particles are easily settle out while they are stored as the electrically conductive paste or the paste easily forms a densified drop during the coating working of the paste. Thus, it was required to add relatively much amount of viscosity modifiers and/or thixotropy additives (hereinafter, referred to as thixotropy additives) as the ingredients of electrically conductive paste. However, such viscosity modifiers/thixotropy additives are generally some sorts of impurities from the viewpoint of adjoining the electrically conductive filler particles electrically and physically, it is preferable that the amount of the filler particles being used is as small as possible.

Moreover, when the paste of the invention of Patent Citation 3 for filling the via holes is, for example, used as the electrically conductive paste for electronic packaging, a short circuit between the electrodes could occur, since the content of the electrically conductive filler particles occupied in the electrically conductive paste is so high as in a range from 85% to 95% by weight and a low resistance metal particles which do not melt during the heating treatment.

Then, the present application has the objects that an electrically conductive path has an electrical resistance as low as possible, the electrically conductive path has a high heat-cycle reliability of the connection in the electrically conductive path, and the electrically conductive path can exclude or reduce the voids which could form therein.

The present application further has the object to prevent the sedimentation of the electrically conductive filler particles in the storing electrically conductive paste, while using the viscosity adjusting/thixotropy imparting additive in a minimum quantity.

Technical Solution

The electrically conductive paste of the present invention is characterized by comprising an electrically conductive alloy filler ingredient comprising alloy particles A, which comprises Sn and one element or a combination of two or more elements selected from the group consisting of Bi, In, Ag and Cu, and alloy particles B which has a melting point lower than that of the alloy particles A and has a mean particle diameter compared with the above-mentioned alloy particles A; a thermosetting resin ingredient; a hardening agent ingredient; a flux ingredient; and a viscosity adjusting/thixotropy imparting additive, wherein the content of the alloy particles A and B is in a range from 75 to 85% by weight of the whole electrically conductive paste.

The electrically conductive filler ingredient in the above-mentioned electrically conductive paste may be characterized in that the melting point of the alloy particles A is in a range from 95° to 220° C. Particularly, the melting point of the alloy particles A has a lower limit temperature, which may be any temperature selected from, for example, 95° C., 100° C., 105° C., 110° C., 115° C., 120° C., 125° C., 130° C., 135° C., 140° C., 145° C., 150° C., 155° C., 160° C., 165° C., 170° C., 175° C. and 180° C., or which may be varied within plus or minus 2° C. or plus or minus 1° C. from each of the above temperature. Similarly, the melting point of the alloy particles A has an upper limit temperature, which may be any temperature selected from, for example, 220° C., 215° C., 210° C., 205° C., 200° C., 195° C., 190° C., 185° C., 180° C., 175° C., 170° C., 165° C., 160° C., 155° C., 150° C., 145° C., 140° C., 135° C., 130° C., 125° C., 120° C. and 115° C., or which may be varied within plus or minus 2° C. (degree C.) or plus or minus 1° C. (degree C.) from each of the above temperature.

The melting point of the alloy particles B can be characterized by a thing low at least 15° C. about the electrically conductive filler ingredient in the above-mentioned electrically conductive paste compared with the melting point of the above-mentioned alloy particles A. It is important in especially the present invention to choose the presentation of the alloy particles B and the alloy particles A so that the melting point of the alloy particles B may become lower than the melting point of the alloy particles A. Therefore, the differences of the melting point of the alloy particles B and the melting point of the alloy particles A are various temperature, such as 15° C., 20° C., 25° C., 30° C., 35° C., 40° C., 45° C., and 50° C., or not less than 55° C., and can take the value of the difference of the range up to about 140° C. at the maximum.

Relating to the electrically conductive filler ingredient in the above-mentioned electrically conductive paste, for example, the alloy particles A has any value of selected from, for example, 1.0 micrometer, 1.5 micrometers, 2.0 micrometers, 2.5 micrometers, 3.5 micrometers, 5 micrometers, 7.5 micrometers, 10 micrometers, 12.5 micrometers, 15 micrometers, 17.5 micrometers and 20 micrometers as the lower limit of the mean particle diameter, and has any value of selected from, for example, 20 micrometers, 25 micrometers, 30 micrometers, 35 micrometers, 40 micrometers, 45 micrometers and 50 micrometers as the upper limit of the mean particle diameter. Therefore, relating to the electrically conductive paste of the present application, the alloy particles A has a mean particle diameter in a range from 1.0 micrometer to 50 micrometers.

Relating to the electrically conductive filler ingredient in the electrically conductive paste, the mean particle diameter of the alloy particles B may be almost the same as that of the alloy particles A. Moreover, it is also preferable that the alloy particles B have a mean particle diameter smaller than that of the alloy particles A. Therefore, the mean particle diameter of the alloy particles B can be 95% or less, or 90% or less, for example 85% or less of the mean particle diameter of the alloy particles A as a preferable feature. On the other hand, the mean particle diameter of the alloy particles B can be at least 65% of the mean particle diameter of the alloy particles A.

The mean particle diameter of the alloy particles B is preferably not less than 67.5%, more preferably not less than 70%, further preferably not less than 72.5%, and particularly not less than 75%.

Relating to the electrically conductive filler ingredient in the electrically conductive paste, the alloy particles B can be characterized by having an alloy composition which comprises Sn and one element or a combination of two or more elements selected from the group of Bi, In, Ag and Cu. However, a combination wherein the composition of the alloy particles B is the same as that of the alloy particles A is never selected, since the melting points differ from each other as mentioned above.

Since the alloy composition which can be selected as the alloy particles B may overlap with the alloy composition which can be selected as the alloy particles A, it is highly likely that the composition of the alloy particles B is similar to that of the alloy particles A as a result. In that case, it is considered that the affinity or compatibility between the alloy particles A and the alloy particles B is so high that, when the alloy particles B having relatively lower melting point had molten, the molten alloy can wet the surface of the alloy particles A that exist very close to the molten alloy particles B.

Relating to the electrically conductive filler ingredient in the electrically conductive paste, it can be characterized that the content of the alloy particles B is in a range from 3 to 30% by weight of the whole electrically conductive filler ingredient.

Moreover, this electrically conductive paste can be characterized that it contains the electrically conductive filler ingredient in a range from 75 to 85% by weight thereof.

In the case where the above electrically conductive paste is used as the electrically conductive paste of the present invention, the melting point of the alloy particles B is selected so that it is surely lower than the melting point of the alloy particles A. Thus, in the course of the heat treatment wherein the electrically conductive paste is heated and hardened, the alloy particles B having the lower melting point melt at first, and can successfully and rapidly wet spread over the surface of the alloy particles A. In a preferable case, since the composition of the alloy particles B is very similar to the composition of the alloy particles A, the molten alloy B can successfully and rapidly wet the surface of the alloy particles A. Since the molten alloy B wet spread over the surface of the alloy particles A and the outside of the alloys is still surrounded with the liquefied resin composite, the air bubbles that formed in this process can relatively easily escape from the resin compositions having the liquefied state toward outside thereof. As a result, it is considered that the interspaces among the alloy particles and the surrounding resin composition can be substantially eliminated, and then the voids which remain within the electrically conductive path after the alloy particles having high melting point had been molten and hardened can be eliminated or reduced.

Moreover, it is designed that the content of the alloy particles B, which have relatively lower melting point, is less than the content of the alloy particles A, which have relatively higher melting point in the electrically conductive filler ingredient, so that the ratio of the content of the alloy particles B is controlled within a range from 3 to 30% by weight based on the electrically conductive filler ingredient. Therefore, it can be expressed that the alloy particles A having the higher melting point are the dominant ingredients in an electrically conductive filler ingredient, and the alloy particles B having the lower melting point are the accessory constituents in the electrically conductive filler ingredient.

In this case, even when the alloy particles B, which have the lower melting point and are the accessory constituents exist, it is capable to design that the melting point of the alloy particles A, which have the higher melting point and are the dominant ingredients, is not substantially affected by the presence of the alloy particles B. Alternatively, it is capable to set so that the electrically conductive filler ingredient has a suitable range of the melting point by suitably combining the alloy particles A with the alloy particles B, with utilizing the presence of the alloy particles B, which have the lower melting point and are the accessory constituents thereof.

Further, the present invention relating to the method of mounting electronic parts on a substrate is characterized by comprising:

applying the electrically conductive paste on the surface of electrodes on the substrate;

placing electronic parts so that each electrode of the parts aligns with the electrically conductive paste;

subjecting the substrate on which the electronic parts were placed to a heat treatment; and cooling the substrate on which the electronic parts were placed, wherein the heat treatment is performed so that the alloy particles A having high melting point is sufficiently molten.

Moreover, the present invention relating to the electronic parts is characterized in that the electric apparatus comprises a substrate on which electronic parts are mounted with using the electrically conductive paste which has the features as mentioned above.

Advantageous Effects

According to the invention of the electrically conductive paste in this application, in the case where electronic parts are mounted on a circuit board, it is capable to joint the electronic parts onto the circuit board relatively rigidly. In addition, it is also capable to attain that the voids, which could exist within the electrically conductive path after the electrically conductive paste has hardened, are eliminated or reduced as far as possible. It is capable to attain the reduction in resistance of the electrically conductive path to be formed and also improve the heat-cycle reliability of the connection by eliminating or reducing the voids, which could exist within the electrically conductive path of the joint part.

Under a condition where the ratio by weight of the electrically conductive filler ingredient occupied in the electrically conductive paste is the same, when a system comprising two kinds of alloy particles, wherein one kind alloy particles having lower melting point is designed to have smaller particle sizes compared with a system comprising two kinds of alloy particles both of which have almost the same particle sizes, it is capable to set that the electrically conductive paste has relatively higher viscosity. Therefore, in order to prevent the sedimentation of the electrically conductive filler particles before use, the electrically conductive paste of the present invention can reduce the amount of the ratio of the viscosity adjusting/thixotropy imparting additive to be added as low as possible when compared with the electrically conductive paste comprising two kinds of alloy particles both of which have almost the same particle sizes.

BEST MODE FOR CARRYING OUT THE INVENTION

First Embodiment

The present embodiment relates to the electrically conductive paste in one mode of the present invention.

It is capable to use a tin based alloy, which can be used as a lead-free solder material, for each of the alloy particles A and B to be used as the electrically conductive filler ingredient in the electrically conductive paste. Such a tin based alloy specifically includes, for example, an alloy composition selected from the group consisting of Sn—Bi, Sn—In, Sn—Bi—In, Sn—Ag, Sn—Cu, Sn—Ag—Cu, Sn—Ag—Bi, Sn—Cu—Bi, Sn—Ag—Cu—Bi, Sn—Ag—In, Sn—Cu—In, Sn—Ag—Cu—In and Sn—Ag—Cu—Bi—In. It is capable to use one metal or an alloy made of a combination of two or more metal selected from the above group as the alloy particles A and B, respectively.

It is preferable to use the alloy composition especially selected from the group of Sn42Bi58, Sn48In52, Sn16Bi56In28, SnAg3Cu0.5, and SnAg3.5Bi0.5In8 as the alloy particles A and B, respectively. Such alloy composition can be used as eutectic composition, respectively.

When the alloy particles A and B are selected from the above-mentioned group, it is important that the melting point of the alloy particles A having the higher melting point is lower than the hardening temperature of the thermosetting resin, which is used for the electrically conductive paste. For example, it is preferable that the melting point of alloy composition is lower than the hardening temperature of the thermosetting resin by around 5° C. to 30° C.

Furthermore, it is capable to select the melting point of the alloy particles B, which have the lower melting point, so that it is lower than the melting point of the alloy particles A, which have the higher melting point, by at least 10° C., for example, 15° C., 17.5° C., 20° C., 22.5° C., 25° C., 27.5° C., 30° C., 32.5° C., 35° C., 37.5° C., 40° C., 42.5° C., 45° C., 47.5° C. and 50° C. or a temperature within plus or minus 2° C. (degree C.) or plus or minus 1° C. (degree C.) from each of the above temperature. Preferably, even when there were differences in the heating rates during the heating process, it is preferable that the difference between the melting points is at least 10° C., so that the melting start temperatures of alloy particles differ from each other. In addition, the melting point of each metal (or alloy) can be measured by a known means such as a differential thermal analyzer, which is known to a person skilled in the art.

The alloy particles are supplied in a form of detailed particles, preferably in a form of spherical particles. After preparing the alloy having a predetermined composition, alloy particles in the form of spherical particles can be obtained by granulating through the operation of atomizing or rolling granulation and so forth.

Relating to the particle diameter of the alloy particles A and B, it is necessary that the mean particle diameter of the alloy particles B is relatively smaller compared with the mean particle diameter of the alloy particles A as mentioned above. For example, when the mean particle diameter of the alloy particles A is in a range from 5 to 50 micrometers, the mean particle diameter of the alloy particles B may be in a range from 1 to 45 micrometers. Even when the range of the particle size distribution of the alloy particles A overlaps with the range of the particle size distribution of the alloy particles B, it is considered that the electrically conductive paste, which has the mean particle diameter of the alloy particles B relatively smaller compared with the mean particle diameter of the alloy particles A (provided that the used amounts are the same), each expressed as the mean particle diameter, can attain higher contribution to the viscosity increase.

Furthermore, it is preferable that the mean particle diameter of the alloy particles B has a size of at least 65% of the mean particle diameter of the alloy particles A. It is more preferable that the mean particle diameter of the alloy particles B has a size of at least 70%, 72.5% or 75% of the mean particle diameter of the alloy particles A. In addition, the particle diameter and the mean particle diameter of the particles can be measured by the means known to a person skilled in the art, such as a particle-size-distribution measuring device, for example, a laser diffraction-type particle-size-distribution measuring device and so forth.

The thermosetting resin may include various resins, such as an epoxy resin, a urethane resin, an acrylic resin, a polyimide resin, a polyamide resin, bismaleimide, a phenol resin, a polyester resin, a silicone resin, and an oxetane resin. They may be used independently or may be used in combination with two or more kinds. Especially among these, an epoxy resin is suitable.

As the epoxy resin, any epoxy resin selected from the group of bisphenol type epoxy resin, polyfunctional epoxy resin, a flexible epoxy resin, brominated epoxy resin, glycidyl ester typed epoxy resin and a polymeric epoxy resin can also be used as the epoxy resin. For example, a bisphenol A type epoxy resin, a bisphenol F type epoxy resin, a bisphenol S type epoxy resin, a biphenyl type epoxy resin, a naphthalene type epoxy resin, a phenol novolak type epoxy resin, a cresol novolak type epoxy resin and so forth are suitably used. Those modified the above-mentioned epoxy resins may also be used. These may be used independently or in combination with two or more kinds thereof.

As a hardening agent used in combination with the above thermosetting resins, a compound selected from the group of a thiol compound, a modified amine compound, a multifunction phenol compound, an imidazole compound, and an acid anhydride compound can be used. The above compounds may be used independently or in combination with two or more kinds thereof. As to the hardening agent, a suitable compound is selected depending on the operating environment and the use of the electrically conductive paste.

As the flux ingredient, a compound which has a reducing power to contribute to melting and bonding or which can remove an oxide film from the surface of the electrodes or the alloy particles as the object material to be bonded in a temperature range at which the electrically conductive paste is heated and hardened. A rosin or a modified rosin, which are described in JIS 23283, can be used as the base compound. In addition, a compound such as a haloid salt of an amine, such as those containing an organic acid or an organic acid salt of amine as an activation ingredient can be used as desired. For example, a saturated fatty monocarboxylic acid such as lauric acid, myristic acid, palmitic acid, stearic acid; an unsaturated fatty monocarboxylic acid such as crotonic acid; a saturated fatty dicarboxylic acid such as oxalic acid, malonic acid, succinic acid, glutaric acid, adipic acid, pimelic acid, suberic acid, azelaic acid, sebacic acid; an unsaturated fatty dicarboxylic acid such as maleic acid, fumaric acid; an aromatic carboxylic acid such as phthalaldehydic acid, phenylbutyric acid, phenoxyacetic acid, phenylpropionic acid; an ether dicarboxylic acid such as diglycolic acid, thiodiglycolic acid, dithiodiglycolic acid; an amine hydrochlorides such as ethylamine hydrochloride, diethylamine hydrochloride, dimethylamine hydrochloride, cyclohexylamine hydrochloride, triethanolamine hydrochloride, glutamic acid hydrochloride; an amine hydrobromide such as diethylamine hydrobromide, cyclohexylamine hydrobromide; and abietic acid and ascorbic acid and so forth can be mentioned.

As the viscosity adjusting/thixotropy imparting additive, an inorganic material or an organic material, for example, from the inorganic materials, silica or alumina, and from the organic materials, a solid epoxy resin, amide compound having low molecular weight, a polyester compound and an organic derivative of castor oil and so forth can be used. The above compounds may be used independently or in combination with two or more kinds thereof.

The electrically conductive paste of the present embodiment may adopt a ratio of each ingredient comprising, for example, about 100 parts by weight of the thermosetting resin, about 400 to 700 parts by weight of the electrically conductive filler, about 1 to 100 parts by weight of the hardening agent, about 1 to 10 parts by weight of the flux ingredient, about 1 to 20 parts by weight of the viscosity adjusting/thixotropy imparting additive. However, the present invention is not limited thereto, but may be selected suitably.

Second Embodiment

The present embodiment relates to a method of producing the electrical and electric device in an embodiment of the present invention, wherein the electronic parts are mounted onto the device.

First, a printed circuit board, wherein wirings are formed on at least one surface of an insulating material (for example, a material selected from the group consisting of polyethylene terephthalate, polyethylene naphthalate, polycarbonate, polyimide, an epoxy resin, an aramid nonwoven fabric, a glass woven fabric, or a nonwoven glass fabric) with an electrically conductive material (for example, copper, gold, a hardened material of an electrically conductive paste and so forth) is prepared. As the circuit board, it can be used that a material, which is commercially available or which can be obtained through a known method.

Next, for example, the electrically conductive paste mentioned in the above first embodiment is supplied to the predetermined portions of the circuit board. In detail, the electrically conductive paste is supplied onto the electrodes (for example, lands) through a screen printing method. Specifically, a mask, which has openings prepared in a predetermined pattern, is arranged on a circuit board, a squeegee is forced to the mask and moved, thereby the electrically conductive paste is printed on the circuit board so as to have a uniform thickness. For that purpose, the mask is preferably a metal mask (or made of a metal) and the squeegee is preferably made of a metal or a fluororesin. After printing, the mask is removed from a circuit board. In addition, instead of the screen printing method, the electrically conductive paste can be supplied to the predetermined portion of the circuit board with the other methods, for example, an inkjet, a dispenser, an impregnation, or a spin coating and so forth.

Then, electronic parts are aligned with and placed on the circuit board, so that the electrodes (for example, leads) of the electronic parts contact with the electrically conductive paste which was printed on the circuit board, thereby the parts are mounted. The method of mounting may vary depending on the kinds of the electronic parts. However, it is sufficient that the electronic parts are placed on the electrically conductive paste, since the electrically conductive paste comes to sufficiently cover the joint part of the electronic parts during the following heat treatment, wherein the viscosity of the electrically conductive paste decreases. Naturally, the electronic parts and the electrically conductive paste can be relatively forced down, thereby they are sufficiently bonded to each other.

The obtained substrate is subjected to a heat treatment. The circuit board onto which the electronic parts have been fixed via the electrically conductive paste is heated from the temperature around the room temperature to increase the temperature. The heat treatment is adjusted so that the circuit board being treated passes through the predetermined temperature profile, wherein the temperature of the circuit board is controlled to exceed the melting point of the alloy particles B of the lower melting point contained in electrically conductive paste, then to reach the temperature which is above the melting point of the alloy particles A of the higher melting point at a predetermined temperature increasing rate in a predetermined period of time, and to reach the hardening temperature of the resin composition at a predetermined temperature increasing rate in a predetermined period of time, and further to be maintained at the temperature. Then after cooling, the circuit board on which the electronic parts are mounted is obtained.

EXAMPLES

Examples 1 to 9

In these Examples, the ratio of the alloy particles B in the electrically conductive filler ingredient and the ratio of the electrically conductive filler ingredient in the electrically conductive paste were investigated. Various electrically conductive pastes each of which has the composition shown in Table 1 was prepared for each of Examples 1 to 9 and Comparative Examples 1 to 5. In addition, each of the electrically conductive fillers having each kind and the ratio was mixed as shown in Table 2.

As the ingredients other than the electrically conductive filler ingredient in the electrically conductive paste, each of the following ingredients was commonly used; a bisphenol F-type epoxy resin (trade name "Epicoat 806", manufactured by Japan Epoxy Resin Co., Ltd.) as the thermosetting resin; an imidazole type hardening agent (Trade Name "Curezole 2P4MZ", manufactured by Shikoku Chemicals, Co. Ltd.) as the hardening agent; a polyester type thixotropy additive (Trade Name "THIXATROL UV1104", manufactured by Elementis Japan) as the viscosity adjusting/thixotropy imparting additive; and a pulverized granular material of adipic acid (particle diameter of about 10 to 40 micrometers) as the flux ingredient.

As the electrically conductive filler, each of a SnAgCu eutectic alloy particles (having the form of spherical particles and melting point of 219° C.) which have the mean particle diameter of 32 micrometers; a SnAgBiIn eutectic alloy particles (the form of spherical particles and melting point of 200° C.) which have the mean particle diameter of 32 micrometers; a SnBi eutectic alloy particles (the form of spherical particles and melting point of 138° C.) which have the mean particle diameter of 32 micrometers; a SnIn eutectic alloy particles (the form of spherical particles and melting point of 119° C.) which have the mean particle diameter of 32 micrometers; a SnBiIn eutectic alloy particles (the form of spherical particles and melting point of 81° C.) which have the mean particle diameter of 32 micrometers was used.

Evaluation of each electrically conductive paste was performed as follows.

In order to mount a LGA device having 13 mm×13 mm (256 electrode lands, Au plated electrode surface, phi 0.5 mm, electrode pitch of 0.8 mm) onto a surface of a substrate board made of glass epoxy and having 0.65 mm thick, electrodes (the surface is Cu plating treated) having the size, pitch and the number of lands, each of which corresponds to the electrode on the LGA device, were prepared and the electrically conductive paste was supplied to the surface of the electrode on the side of the substrate board by screen printing method. LGA device was aligned and placed on the electrodes on the side of the substrate board via the electrically conductive paste. Then the board was subjected to a heat treatment, wherein the temperature is increased from the room temperature until the temperature at which the alloy particles A and B are molten and the hardening of the resin is attained (hereinafter referred to as a "hardening temperature" for the sake of convenience) at a temperature increasing rate of 4° C., the hardening temperature is maintained for 10 minutes, and then the temperature is automatically decreased till the room temperature. Thereafter, the joint part was examined by X-ray observation.

Therefore, during the temperature increasing process from the room temperature until the hardening temperature, the alloy particles B of the lower melting point is molten and wet the surface of the alloy particles A, then the alloy particles A is molten and the electrically conductive filler ingredient agglomerates within the resin, which is still in a liquefied condition, and subsequently the resin hardens. As a result, the electrically conductive filler ingredient is maintained within the hardened resin in an agglomerated condition. Thus, an electrically conductive path is formed within the resin. Therefore, the hardening temperature will come to be a temperature which is higher than the both melting points of the alloy particles A and B, and can attain the hardening of the resin. In the case of Example 1 as shown in Table 2, the hardening temperature was set at 160° C. As to the other Examples, the hardening temperature was set at 160° C. in Examples 2 to 7, the hardening temperature was set at 240° C. in Examples 8 to 11, the hardening temperature was set at 220° C. in Examples 12 to 14, and the hardening temperature was set at 140° C. in Example 15.

The voids which existed within the joint part formed with the electrically conductive paste was evaluated as follows. From the X-ray image of the joint parts obtained by the observation, a ratio of the area of the existing voids in the section (when a plurality of voids exist, the sum of each void's area) to the cross-sectional area of the joint part is calculated and the value of that ratio in Comparative Example 1 is set as 100 for comparison. In addition, the other difference, if any, was described as special instructions. On that basis, in the example where quality improvement was found was evaluated as "O" and in the example where quality improvement was not found was evaluated as "X".

TABLE 1

| Thermo-setting resin | Hardening agent | Flux ingredient | Viscosity adjusting/ thixotropy imparting additive | Electrically conductive filler |
|---|---|---|---|---|
| Bisphenol F-type epoxy resin 100 parts by weight | Imidazole type hardening agent 1-5 parts by weight | Adipic acid 2 parts by weight | Polyester type 20 parts by weight | See Table 2 |

TABLE 2

| | Composition of alloy particles A | Composition of alloy particles B | Ratio of B in the alloy (B/A + B) (%) | Content of Electrically Conductive Filler (%) | Voids Ratio (%) | Note | Evaluation |
|---|---|---|---|---|---|---|---|
| Comparative Example 1 | SnBi | — | 0 | 80 | 100 | | x |
| Example 1 | SnBi | SnBiIn | 8 | 80 | 35 | | o |
| Example 2 | SnBi | SnIn | 8 | 80 | 60 | | o |
| Comparative Example 2 | SnBi | SnBiIn | 8 | 70 | 115 | Many Remaining balls | Δ |
| Example 3 | SnBi | SnBiIn | 8 | 75 | 70 | | o |
| Example 4 | SnBi | SnBiIn | 8 | 85 | 45 | | o |
| Comparative Example 3 | SnBi | SnBiIn | 8 | 90 | 55 | Many Remaining balls | Δ |
| Comparative Example 4 | SnBi | SnBiIn | 2 | 80 | 110 | | Δ |
| Example 5 | SnBi | SnBiIn | 3 | 80 | 90 | | o |
| Example 6 | SnBi | SnBiIn | 20 | 80 | 40 | | o |
| Example 7 | SnBi | SnBiIn | 30 | 80 | 30 | | o |
| Comparative Example 5 | SnBi | SnBiIn | 40 | 80 | 95 | Short Circuit occurred | Δ |
| Example 8 | SnAgCu | SnAgBiIn | 8 | 80 | 80 | | o |
| Example 9 | SnAgCu | SnBi | 8 | 80 | 70 | | o |
| Example 10 | SnAgCu | SnIn | 8 | 80 | 80 | | o |
| Example 11 | SnAgCu | SnBiIn | 8 | 80 | 85 | | o |
| Example 12 | SnAgBiIn | SnBi | 8 | 80 | 50 | | o |
| Example 13 | SnAgBiIn | SnIn | 8 | 80 | 55 | | o |
| Example 14 | SnAgBiIn | SnBiIn | 8 | 80 | 65 | | o |
| Example 15 | SnIn | SnBiIn | 8 | 80 | 75 | | o |

In describing in the cells of Examples, SnBi means Sn42Bi58, SnIn means Sn48In52, SnBiIn means Sn16Bi56In28, SnAgCu means SnAg3Cu0.5, and SnAgBiIn means SnAg3.5Bi0.5In8, respectively.

According to the comparison of Comparative Example 1 with Examples 1 and 2, it can be understood that the electrically conductive paste of the present invention, which contains the alloy particles of a higher melting point and the alloy particles of the lower melting point, can decrease the voids ratio compared with the paste containing merely a single alloy particles. Thus, it can also be understood that when the electrically conductive paste of the present invention, which contains the alloy particles of a higher melting point and the alloy particles of the lower melting point is used, the voids ratio can be decreased based on these above examples.

According to the comparison of Comparative Example 1 with Examples 1 and 4 to 5, it can be understood that the preferable content of the electrically conductive filler in the electrically conductive paste resides in the range from about 75 to 85% by weight in the present invention. For example, in the paste having 70% of the electrically conductive filler content (Comparative Example 2), dripping of the paste during print coating of the electrically conductive paste and insufficient agglomeration of the alloy particles during heat hardening due to the low density of the electrically conductive filler were found. Thus, not so good result was obtained. In addition, in the paste having 90% of the electrically conductive filler content, the amount of the flux ingredient to the amount of the electrically conductive filler was insufficient, so that many remaining balls were found. Thus, not so good result was obtained.

According to the comparison of Comparative Example with Examples 4 to 5 and 6 to 8, when the electrically conductive paste has the ratio of the alloy particles B to the electrically conductive filler ingredient (namely, the alloy particles A and alloy particles B) in the range from 3 to 30% by weight, it is found that the paste shows the effect of the present invention. When the ratio of the alloy particles B comes to 2% as in the case of Comparative Example 4, the effect of void reduction was low. The reason is considered that the content of the alloy particles B is too short. When the ratio of the alloy particles B comes to 40% as in the case of Comparative Example 5, failures such as short circuits between the electrodes were observed in some joint parts. The reason is considered that the content of the alloy particles B in the electrically conductive filler ingredient is so high that the electrically conductive filler ingredient can not fulfill its function as the electrically conductive filler ingredient having the melting point of the alloy particles A of the higher melting point. Therefore, the electrically conductive filler ingredient as a whole comes to have an alloy composition which has the melting point lower than that of the alloy particles A.

Then, as Examples 9 to 12 of the present invention and Comparative Example 1, various electrically conductive pastes each of which has the composition as shown in Table 3 was prepared. In Examples 1 and 9 to 12, the content of the alloy particles B in the electrically conductive filler ingredient was set constant at 8%. Each of the following ingredients was commonly used; a bisphenol F-type epoxy resin (trade name "Epicoat 806", manufactured by Japan Epoxy Resin Co., Ltd.) as the thermosetting resin; an imidazole type hardening agent (Trade Name "Curezole 2P4MZ", manufactured by Shikoku Chemicals, Co. Ltd.) as the hardening agent; a poly- ester type thixotropy additive (Trade Name "THIXATROL UV1104", manufactured by Elementis Japan) as the viscosity adjusting/thixotropy imparting additive; and a pulverized granular material of adipic acid (particle diameter of about 10 to 40 micrometers) as the flux ingredient.

As the alloy particles A of the electrically conductive filler ingredient, the SnBi eutectic alloy particles (having the form of spherical particles and melting point of 138° C.) which have the mean particle diameter of 32 micrometers were used. In order to compare the effect resulted from the particle size, each of the SnBiIn eutectic alloy particles (having the form of spherical particles and the melting point of 81° C.) each having the mean particle diameter is 32 micrometers, the mean particle diameter is 28 micrometers, the mean particle diameter is 21 micrometers, and the mean particle diameter is 10 micrometers, respectively was used as the alloy particles B of the lower melting point.

The viscosity of each sample of the prepared electrically conductive paste was measured using E type viscometer (at 25° C., 1.0 rpm). A metal mask having a thickness of 0.2 mm and an opening having a diameter of 3 mm was placed on a ceramic substrate board and an electrically conductive paste was printed thereon. The substrate board was heated in an oven at a temperature of 160° C. for 10 minutes, cooled to the ambient temperature and counted the number of the remaining balls by the microscope observation. The amount of the remaining balls was evaluated based on the result of Comparative Example 1, the result of which being set as medium, and the results are shown in the column of determination in Tables.

TABLE 3

| Composition | | | | |
|---|---|---|---|---|
| Thermo-setting resin | Hardening agent | Flux ingredient | Viscosity adjusting/ thixotropy imparting additive | Electrically conductive filler |
| Bisphenol F-type epoxy resin 100 parts by weight | Imidazole type hardening agent 5 parts by weight | Adipic acid 2 parts by weight | Polyester type 10-20 parts by weight | See Table 4 500 parts by weight |

TABLE 4

| | Composition of alloy particles A | Composition of alloy particles B | Particle diameter of alloy particles B (micrometer) | Ratio of B in the alloy (B/A + B) (%) | Added viscosity adjusting/ thixotropy imparting additive (parts by weight) | Viscosity (Pa·s) | Evaluation |
|---|---|---|---|---|---|---|---|
| Comparative Example 1 | SnBi | — | — | 0 | 20 | 1065 | Medium |
| Example 1 | SnBi | SnBiIn | 32 | 8 | 20 | 1170 | Medium |
| Example 9 | SnBi | SnBiIn | 28 | 8 | 20 | 1200 | Medium |
| Example 10 | SnBi | SnBiIn | 21 | 8 | 20 | 1390 | Slightly low |
| Example 11 | SnBi | SnBiIn | 10 | 8 | 20 | 14825 | High |
| Example 12 | SnBi | SnBiIn | 21 | 8 | 10 | 1030 | Low |

According to the comparison of Comparative Example with Examples 1 and 9 to 12, it is confirmed that the viscosity of the electrically conductive paste as a whole increases in the case where the electrically conductive filler ingredient contains two groups of the alloy particles, wherein one group has relatively smaller particle size than that of the other group, when compared with the case where than that of the other group, is used compared with the electrically conductive filler ingredient contains uniform particle size. When the mean particle diameter of the alloy particles B is 28 micrometers (particle diameter at 88% of the alloy particles A), the effect relating to the viscosity increase was not so remarkable, but when the mean particle diameter of the alloy particles B was 21 micrometers (particle diameter at 65% of the alloy particles A), remarkable effect on the viscosity increase was admitted. When the mean particle diameter of the alloy particles B was 10 micrometers (particle diameter at 31% of the alloy particles A), a certain amount of thickening effect was admitted, but the presence of the unmolten metal of the alloy particles B was found. In addition, it was admitted that the amount of the remaining solder balls increases. The reason is considered that the difference of the particle diameters between the alloy particles A and B is so large that the alloy particles that were not molten had remained due to such as the oxidation of the surface of the alloy particles. Therefore, it is contemplated that the alloy particles B is necessary to have the mean particle diameter of 21 microns or more and that the size of the alloy particles B is necessary to have at least 65% of the mean particle diameter of the alloy particles A.

When Comparative Example 1 and Examples 1, 9, 10 and 11, each of which uses the same ratio of the viscosity adjusting/thixotropy imparting additive, are compared, it is found that the viscosity in Examples 1, 9, 10 and 11 each of which uses the alloy particles B had increased rather than Comparative Example 1, and that the degree of viscosity increase becomes higher in order of decreasing the mean particle diameter of the alloy particles B. When Examples 10 and 12, each of which uses the same particle diameter of the alloy particles B, the degree of viscosity increase in Example 12 is lower than that of Example 10, wherein the ratio of the viscosity adjusting/thixotropy imparting additive is lower in Example 12, and that the viscosity is almost equivalent to that of the Comparative Example 1. Therefore, it was confirmed that the ratio of the viscosity adjusting/thixotropy imparting additive to be used can be reduced by adding the alloy particles B having smaller particle diameter to the alloy particles A. In addition, the amount of the remaining balls observed in Example 12 was the least in Examples shown in Table 4. It is considered that the above effect of reduced amount of the remaining balls was resulted from the reduced ratio of the viscosity adjusting/thixotropy imparting additive in the electrically conductive filler ingredient.

INDUSTRIAL APPLICABILITY

The electrically conductive paste, the mounting method, the substrate and the structure of the present invention can be used for an extensive use in the field of the electrical and electric device/electronic circuit manufacturing technology. For example, the present invention can be used for connecting the electronic components onto the circuit board having so high integration and a minute wiring pattern, such as CCD elements, holographic elements and chip components and for bonding them onto the board. As a result, the present invention can be used for the product which houses these elements, parts and/or a substrate, for example, DVDs, cellular phones, portable AV equipment and digital cameras and so forth.

The invention claimed is:

1. An electrically conductive paste comprising:
   from 75 to 85% by weight of an electrically conductive filler ingredient comprising alloy particles A made of a combination of Sn and one or more elements selected from the group consisting of Bi, In, Ag and Cu, and alloy particles B made of a combination of Sn and one or more elements selected from the group consisting of Bi, In, Ag and Cu; a thermosetting resin ingredient; a hardening agent ingredient; a flux ingredient; and a viscosity adjusting/thixotropy imparting additive,
   wherein a content of the alloy particles B is 3 to 20% by weight based on 100% by weight of the electrically conductive filler ingredient;
   a melting point of the alloy particles B is at least 10° C. and at most 50° C. lower than a melting point of the alloy particles A; and
   the melting point of the alloy particles A is in a range from 95 to 220° C. and is lower than a hardening temperature of the thermosetting resin ingredient.

2. The electrically conductive paste according to claim 1, wherein the melting point of the alloy particles B is at least 15° C. and at most 50° C. lower than the melting point of the alloy particles A.

3. The electrically conductive paste according to claim 1, wherein the alloy particles A has a mean particle diameter which is larger than the mean particle diameter of the alloy particles B.

4. The electrically conductive paste according to claim 1, wherein the alloy particles A has a mean particle diameter in a range from 1.0 to 50 micrometers.

5. A method of mounting electronic parts on a substrate characterized by comprising:
   applying electrically conductive paste according to claim 1 on the surface of electrodes on the substrate;
   placing electronic parts so that each electrode of the parts aligns with the electrically conductive paste;
   subjecting the substrate on which the electronic parts were placed to a heat treatment; and
   cooling the substrate on which the electronic parts were placed, wherein the heat treatment is performed so that the alloy particles A having a high melting point is sufficiently molten.

6. An electric apparatus comprising a substrate on which electronic parts are mounted with the electrically conductive paste according to claim 1.

* * * * *